(12) United States Patent
Leuschner

(10) Patent No.: US 7,083,990 B1
(45) Date of Patent: Aug. 1, 2006

(54) METHOD OF FABRICATING MRAM CELLS

(75) Inventor: Rainer Leuschner, Samoreau (FR)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/044,729

(22) Filed: Jan. 28, 2005

(51) Int. Cl.
*H01L 21/00* (2006.01)
(52) U.S. Cl. .................................. 438/3; 257/E21.665
(58) Field of Classification Search .................. 438/3; 257/E21.665
See application file for complete search history.

(56) References Cited

U.S. PATENT DOCUMENTS

| | | | | |
|---|---|---|---|---|
| 6,413,788 | B1 * | 7/2002 | Tuttle ............................. | 438/3 |
| 6,707,083 | B1 * | 3/2004 | Hiner et al. ................. | 257/295 |
| 6,803,615 | B1 * | 10/2004 | Sin et al. ..................... | 257/295 |
| 6,921,953 | B1 * | 7/2005 | Deak ........................... | 257/421 |
| 2003/0206434 | A1 * | 11/2003 | Lauschner et al. .......... | 365/173 |
| 2006/0019487 | A1 * | 1/2006 | Leuschner et al. .......... | 438/637 |
| 2006/0022286 | A1 * | 2/2006 | Leuschner et al. .......... | 257/421 |

* cited by examiner

*Primary Examiner*—B. William Baumeister
*Assistant Examiner*—Igwe U. Anya
(74) *Attorney, Agent, or Firm*—Edell, Shapiro & Finnan, LLC

(57) ABSTRACT

A method of fabricating an MRAM cell including providing a workpiece having at least one magnetic tunnel junction (MTJ) formed thereon, forming an insulating layer made of non-conductive, isolating material over the at least one MTJ, using a damascene process to form at least two adjacent first trenches in the insulating layer, filling the first trenches in the insulating material with a conductive material and polishing the conductive material to form conductive lines, etching of at least a second trench in the insulating layer in between the conductive lines, depositing a ferromagnetic liner material at least over the conductive lines and the second trench; and removing of the ferromagnetic liner material from the bottom surface of said second trench to form ferromagnetic liners of the conductive lines. The second trench has side walls and a bottom surface at a specified aspect ratio.

12 Claims, 2 Drawing Sheets

METHOD OF FABRICATING MRAM CELLS

FIELD OF THE INVENTION

The present invention relates to non-volatile magnetoresistive random access memory cells for use in a semiconductor integrated circuit and to a method of fabricating magnetoresistive memory cells.

BACKGROUND

Magnetoresistive random access memory (MRAM) is a memory technology that may replace dynamic random access memory (DRAM) as the standard memory for computing devices. Non-volatile MRAMs allow for "instant on" systems, i.e., systems that come to life as soon as the computer system is turned on.

An MRAM cell includes a structure having ferromagnetic layers separated by a non-magnetic tunneling barrier layer that are arranged into a magnetic tunneling junction (MTJ). Digital information is stored and represented as specific orientations of magnetic moment vectors in the ferromagnetic layers. More particularly, the magnetization of one ferromagnetic layer (reference layer) is magnetically fixed or pinned, while the magnetization of the other ferromagnetic layer (free layer) can be switched between two preferred directions in the magnetization easy axis. The magnetization easy axis is typically selected to be in parallel alignment with the fixed magnetization of the ferromagnetic reference layer. Relative orientations of the free layer magnetization are also known as "parallel" and "antiparallel" states, respectively, which exhibit two different resistance values in response to a voltage applied across the magnetic tunneling junction (MTJ) barrier layer. Hence, the resistance of the MTJ reflects a specific state, which is decreased when the magnetization is parallel and increased when the magnetization is antiparallel. Detection of resistivity allows an MRAM cell to provide logic information assigned the two different resistivity states.

An MRAM cell is written by the application of magnetic fields that are made to be coupled to the free layer magnetization and generated by bi- or uni-directional currents running through current lines positioned adjacent to the memory cell.

Fabrication of MRAM cells is typically integrated into the back end wiring structure in conventional back-end-of-line CMOS processing.

To be useful in present day electronic devices, particularly, in portable apparatuses such as notebook computers, digital still cameras, and the like, very high-density arrays of magnetic memory cells are required. Accordingly, scaling down the memory cell size is an essential precondition for practical usage. However, there are many obstacles to successfully down-sizing MRAM cells. One problem that arises in scaling-down MRAM cells is that the magnetic switching fields for reversing the ferromagnetic free layer magnetization increase at approximately $1/\sqrt{w}$, where w is the width of the cell. Thus, if MRAM cells become smaller and smaller, field selected switching becomes more difficult. Hence, strong magnetic fields are required for field selected switching, i.e., large switching currents running through the current lines.

In order to overcome the problem of increased switching currents, a ferromagnetic liner has been added around the current lines to lower the power consumption due to a concentration or focusing of the magnetic flux, and requiring smaller switching currents. Also, the ferromagnetic liners act as genetic shields to prevent adjacent memory cells from being inadvertently switched. In general, such ferromagnetic liners are fabricated using two different strategies.

In a first approach, using a conventional damascene process, a trench is formed in an insulating material above a magnetic tunnel junction (MTJ), followed by creating ferromagnetic side wall spacers in the trench and filling the trench with a conductive material, such as Copper (Cu), that is polished to remove conductive material outside the trench to produce a conductive line in the trench. After polishing, a ferromagnetic cap layer is deposited on top of the line, for example, using an electro(less) plating technique. Such a manufacturing process involves many process steps and, therefore, is both cost and time consuming. Otherwise, process conditions of electro(less) plating are critical regarding purity of the deposited layer, which is very likely to result in severe quality problems (formation of seeds between the lines). Furthermore, polishing the conductive material followed by deposition of a cap layer results in an approximately 90° corner of ferromagnetic layers (side walls and cap layer), which, however, should be avoided in view of a magnetic flux leakage likely to occur at the corners. Moreover, if the ferromagnetic cap layer is deposited by sputtering and followed by a patterning via lithography and metal etching, the overlay errors can be critical with respect to the magnetic flux closure between the sidewall spacers and the cap layer.

In a second approach to create a ferromagnetic liner, in a sacrificial insulating material process, an up-standing metal line that projects from the insulating material is created most practically using electro-chemical growth, i.e., an electro(less) plating technique, followed by depositing a ferromagnetic liner using also a surface-selective electro(less) plating technique. As described above in connection with the damascene process, the plating process is the critical process with respect quality problems in view of a lacking purity of the deposited layer. After an up-standing metal line that projects from the insulating material is created, the ferromagnetic liner may also be deposited using a sputtering process at least over the metal line that then is patterned via lithography and metal etching. As described in connection with the damascene process, this requires an additional lithography step and the overlay errors can be critical with respect to the magnetic flux concentration effect.

An improved method of fabricating a magnetoresistive memory cell that allows for improved fabrication of a ferromagnetic liner is desirable.

SUMMARY

In a general aspect, a method of fabricating a magnetoresistive random access memory (MRAM) cell includes providing a workpiece having at least one magnetic tunnel junction (MTJ) formed thereon and forming an insulating layer made of non-conductive, isolating material over the at least one MTJ. Then, using a conventional damascene process, filling a plurality of (for example, at least two) adjacent first trenches in the insulating layer of the insulating material with a conductive material and polishing the conductive material to form conductive lines.

Then, at least a second trench in the insulating layer in between the conductive lines is etched such that the second trench is limited by side walls and a bottom surface at a selected aspect ratio. In general, a second trench is etched between each pair of adjacent conductive lines. In a typical arrangement, each second trench approximately spans the distance between adjacent conductive lines. In other words, the second trenches, for example, are formed by the upstanding conductive lines. Optionally, for etching the second trenches an additional etch stop layer may be formed in the insulating layer. Afterwards, a ferromagnetic liner material is deposited at least over the conductive lines and the second trenches formed in between them, which then is removed from the bottom surface of the second trenches to form ferromagnetic liners surrounding the conductive lines on their top and side walls.

In this specification, the term "aspect ratio" is defined as a ratio of height to width of a trench. Further, the term "specified aspect ratio" means that the aspect ratio is selected in view of the method used for etching the trench. In an exemplary embodiment of the invention, the aspect ratio is at least 0.5. More particularly, the aspect ratio is at least 1. In case that the distance between adjacent conductive lines is too large for a specified aspect ratio "dummy" conductive lines are inserted to increase the aspect ratio of second trenches between the conductive lines. Dummy lines are similar in construction to typical conductive lines, but do not function other than to increase the aspect ratio of the trenches.

For deposition of the ferromagnetic liner material, for example, a sputter-deposition technique is used. For removing the ferromagnetic liner material, for instance, a sputter-etch technique is used. In case the aspect ratio of the second trenches is at least 0.5, or in another example, at least 1, and using a sputter-deposition technique for depositing the ferromagnetic liner material less ferromagnetic liner material is deposited on the bottom surface than on the top surface. Deposition on the side walls of the second trenches is normally less than that on the bottom, but it can be improved by a bias voltage during the deposition resulting in thicker deposition on the sidewalls than on the bottom.

Otherwise, in case the aspect ratio of the second trenches is at least 0.5, or in another example at least 1, and using a sputter-etch technique for removing the ferromagnetic liner material from the bottom surface of the second trenches, more ferromagnetic liner material is removed from the bottom surface than from the side walls of the second trenches.

In the method of the present invention, a first diffusion barrier layer is formed between the insulating layer material and the conductive material of the conductive lines that prevents diffusion of material between the insulating layer and conductive material of the conductive lines. In case that the insulating layer (interlayer dielectricum) is an oxide, for example, $SiO_2$, normally a fluorine-containing plasma is used for the trench etch. In that case, the material for the first diffusion barrier layer is Ti/TiN because it is stable in fluorine-containing plasma and protects the conductive material of the conductive line. In another case in which an organic insulating layer (interlayer dielectricum) is used, any diffusion barrier layer material mentioned below is used because the material withstands the etch process.

Hence, each second trench approximately spans the distance between adjacent conductive lines, i.e., the distance between diffusion barrier layers of adjacent conductive lines.

Further, a second diffusion barrier layer is formed in each one of second trenches before the ferromagnetic liner material is deposited. Such second diffusion barrier layer avoids diffusion between the ferromagnetic liner material and the isolating material.

Both first and second diffusion barrier layers may be designed to be two-layered structures that include a first sublayer made of metal nitride, such as TaN, WN, or TiN, and a second sublayer made of metal, where the metal nitride sublayer is positioned at the isolating layer material side and the metal sublayer is positioned at the conductive line material side. For example, when sputter-depositing the ferromagnetic liner material, both first and second diffusion barrier layers are deposited by sputter-deposition, which allows deposition of state of the art high-quality diffusion barriers.

According to another aspect of the invention, an MRAM cell fabricated by the method includes at least one magnetic tunneling junction (MTJ), an insulating layer made of non-conductive, isolating material over the at least one MTJ, and at least two adjacent conductive lines in the insulating layer. Each one of the conductive lines has a ferromagnetic liner of ferromagnetic material comprised of top and side wall layers. Accordingly, the ferromagnetic liners can have rounded corners connecting the top and side wall ferromagnetic liner layers to avoid a magnetic flux leakage through the corners, as in prior art ferromagnetic liners.

The method of fabricating an MRAM cell can include an electroless or electro plating sputter deposition for depositing the ferromagnetic liner material. That deposition process is not selective and creates a short path between the conductive lines. The ferromagnetic liner material can be etched out using a resist mask that protects the ferromagnetic liner material on the conductive lines where it should not be removed. However, etching out of the ferromagnetic liner material using a resist mask requires an additional mask level and implies that overlay errors change the properties of the ferromagnetic liner, as in prior art described above. However, in the method of the invention, a sputter etch process can be used for removing the ferromagnetic liner material and the ferromagnetic liner material can be cleared from the bottom surfaces of the second trenches that, for example, are formed by the up-standing conductive lines without eliminating the ferromagnetic liner material on top of the conductive lines. The deposition rate in a sputter process depends on the width of the trenches. For narrow trenches (e.g., width smaller than 500 nm) the sputter deposition rate is reduced by about a factor of 2. But the sputter etch rate depends much less on the trench width because it is much more directional. In that way, the trench bottom can be cleared without removing the ferromagnetic liner material from the top of the line. The sputter-etched material is redeposited onto the sidewalls, which helps to increase the ferromagnetic liner thickness there. The sputter etch has some impact on the material quality, but the effect is small enough that it can be ignored. If there are large spaces in the chip layout, the process according to the invention requires dummy patterns in order to generate small second trenches and to avoid any shorting between the conductive lines as above-mentioned. The ferromagnetic liner material can be deposited by sputtering which allows much more freedom for the materials and offers the possibility to deposit state of the art high quality diffusion barriers between the magnetic material and the conductive material of the conductive lines. Also, lithography step to remove the ferromagnetic liner material between the conductive lines is avoided. By creating ferromagnetic liners having rounded corners connecting their side wall and top layers to avoid magnetic flux leakage, a further reduction of magnetic switching fields compared to the conventional ferromagnetic liners can be achieved.

BRIEF DESCRIPTION OF THE DRAWINGS

The accompanying drawings, which are incorporated in and constitute a part of the specification, illustrate a presently preferred embodiment of the invention, and together with the general description given above and the detailed description given below, serve to explain the principles of the invention. In the following figures, like designations denote like elements.

DETAILED DESCRIPTION

Referring to FIGS. 1A through 1E, a method of forming an MRAM cell of the invention is explained schematically, where FIGS. 1A through 1E are schematic sectional views of conductive lines above MTJs.

Figure 1A:
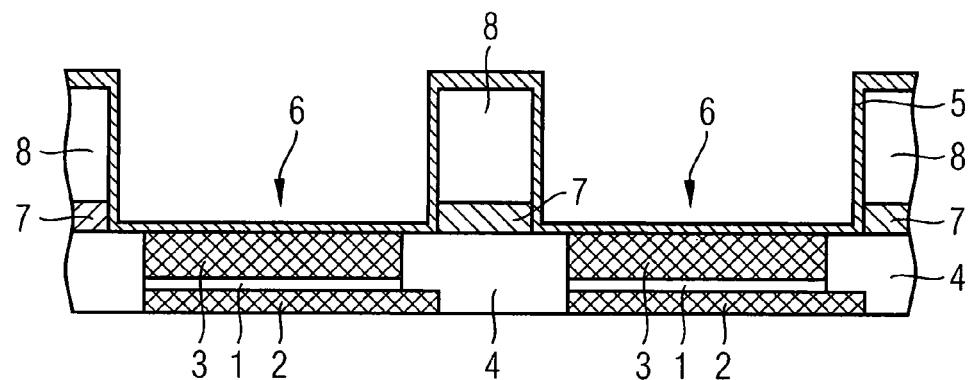
FIGS. 1A to 1E illustrate schematically an exemplary embodiment of a method of forming a magnetoresistive memory cell of the invention.

FIG. 1A shows a stage during fabrication of MRAM cells where a workpiece with a plurality of magnetic tunnel junctions (MTJs) 1 has a first sacrificial interlayer dielectric (ILD) insulating layer 4 that is, for instance, 400 nm thick TEOS deposited thereon. Next, there is chemical-mechanical polishing reduces topography and/or back-polishing and back-etch to MTJ hard mask level. Then, an etch stop layer 7 for instance, 30 nm thick Siliconnitride or Siliconcarbide is deposited. This is followed by a deposition of a second sacrificial ILD insulating layer 8 (for instance, 400 nm thick TEOS) and patterning of the metal level above the MTJs, including reactive ion etching down to the etch stop layer 7 and opening of the etch stop layer 7 to create first trenches 6. Above each MTJ 1, an upper conductive contact 3, and below each MTJ 1, a lower conductive contact 2 for contacting the MTJ, are provided.

Figure 1B:
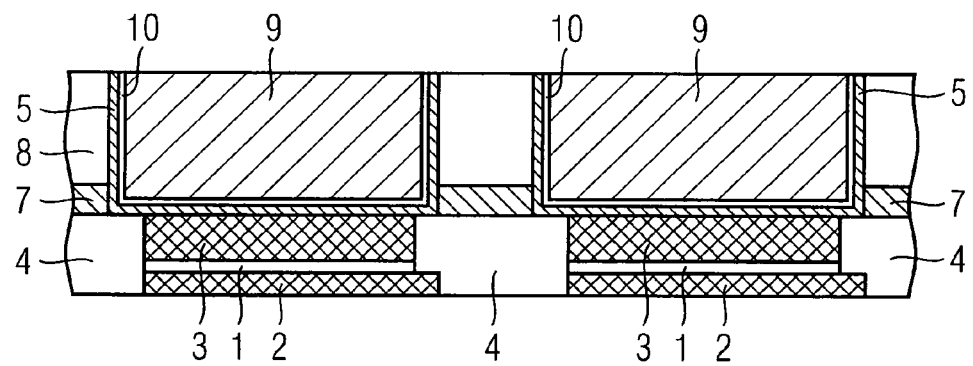

FIG. 1B shows where a normal state of the art diffusion barrier having a two-layered structure of metal nitride 5/nitride 10 is deposited and is followed by deposition of conductive material, such as Cu. Then, the diffusion barrier 5, 10 and the conductive material has been polished to create conductive lines 9 (damascene process).

Figure 1C:
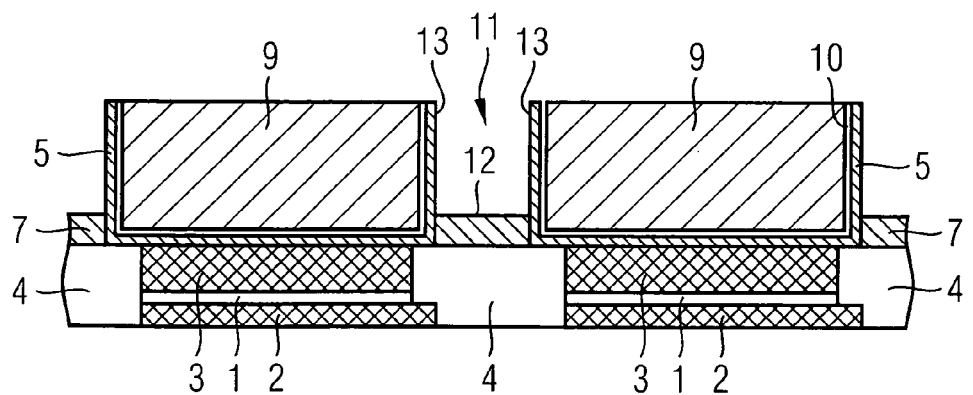

FIG. 1C shows where the second ILD insulating layer 8 has been etched with etch stop on the etch stop layer 7 to create second trenches 11 having side walls 13 and a bottom surface 12. At that point the conductive lines 9 are rounded on top to avoid the magnetic flux leakage as magnetic flux flows through the magnetic liner. Optionally, a state of the art diffusion barrier layer is deposited in a sputter tool. The thickness after deposition is approximately 10 nm on up area, 2 nm on the sidewalls, and 5 nm at the trench bottom. The second trenches 11 are spaces between the conductive lines 9. An aspect ratio of the second trenches 11 is at least 0.5, and more particularly, at least 1, as defined by the distance of the first trenches 6.

Figure 1D:
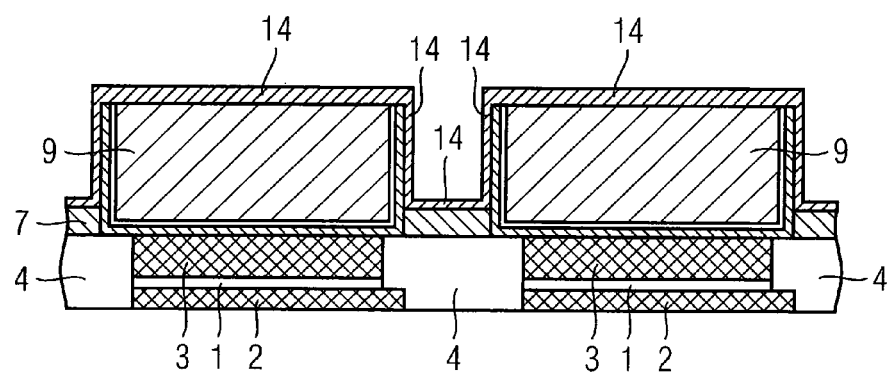

FIG. 1D shows where a ferromagnetic liner material 14 is deposited in a sputter tool over the conductive lines 9 and second trenches and 11. The thickness after deposition is approximately 40 nm on up area, 10 nm on the sidewalls, and 20 nm at the trench bottom. Note that the bottom surface 12 of the second trench 11 is covered by the ferromagnetic liner material 14.

Figure 1E:
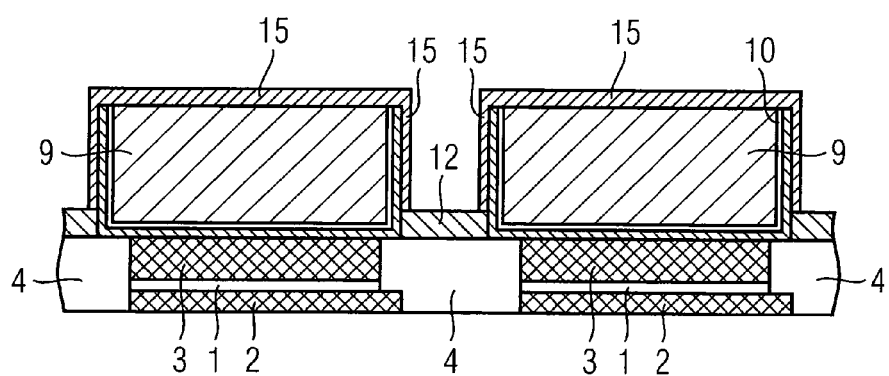

FIG. 1E shows where the ferromagnetic liner material 14 is resputtered in the etch chamber of the sputter tool to create ferromagnetic liners 15. The thickness after resputtering is approximately 20 nm on up area, 20 nm on the sidewalls, and 0 nm at the trench bottom 12. Accordingly, the ferromagnetic liner material 14 is removed from the second trench bottom surface 12, leaving ferromagnetic liner material 14 on top of the conductive lines 9 and on the side walls of the second trench 11.

Finally, an insulating diffusion barrier (e.g., siliconcarbide) is deposited (not shown), and followed by a deposition of a third ILD (e.g., TEOS) with a thickness that exceeds the double of the conductive lines height (not shown). Then, there is polishing of the third ILD such that the surface is flattened or smoothed and for the ILD thickness above the conductive lines is the predetermined spacing for the next metal level (not shown).

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

LIST OF REFERENCE SYMBOLS 1 magnetic tunnel junction (MTJ)
2 lower contact
3 upper contact
4 first ILD
5 diffusion barrier layer sublayer
6 first trench
7 etch stop layer
8 second ILD
9 conductive line
10 diffusion barrier layer sublayer
11 second trench
12 second trench bottom surface
13 second trench side wall
14 ferromagnetic liner material
15 ferromagnetic liner

What is claimed is:

1. A method of fabricating an MRAM cell, comprising:
   providing a workpiece having at least one magnetic tunnel junction (MTJ) formed thereon;
   forming an insulating layer made of non-conductive, isolating material over the at least one MTJ;
   using a damascene process to form at least two adjacent first trenches in the insulating layer;
   filling the first trenches in the insulating material with a conductive material; and
   polishing the conductive material to form conductive lines;
   etching at least a second trench in the insulating layer between the conductive lines, the second trench having side walls and a bottom surface at a specified aspect ratio;
   depositing a ferromagnetic liner material at least over the conductive lines and the second trench; and
   removing the ferromagnetic liner material from the bottom surface of the second trench to form ferromagnetic liners of the conductive lines.

2. The method of claim 1, wherein the ferromagnetic liner material is deposited using a sputter-deposition technique.

3. The method of claim 1, wherein the ferromagnetic liner material is etched using a sputter-etch technique.

4. The method of claim 1, wherein an aspect ratio of the second trench is at least 0.5.

5. The method of claim 1, wherein an aspect ratio of the second trench is at least 1.

6. The method of claim 1, further comprising:
   forming an etch stop layer in the insulating layer to stop etching of the second trench in the insulating layer.

7. The method of claim 1, further comprising:
   forming a first diffusion barrier layer in between the insulating layer and the conductive material of conductive lines.

8. The method of claim 7, wherein the first diffusion barrier layer resists etching the second trench in the insulating layer.

9. The method of claim 7, further comprising:
   forming a second diffusion barrier layer in the second trench before depositing the ferromagnetic liner material.

10. The method of claim 9, wherein the first and second diffusion barrier layers are two-layers structures, respectively, comprised of a first sublayer of metal nitride and a second sublayer of metal.

11. An MRAM cell fabricated by a method including providing a workpiece having at least one magnetic tunnel junction (MTJ) formed thereon, forming an insulating layer made of non-conductive, isolating material over the at least one MTJ, using a damascene process to form at least two adjacent first trenches in the insulating layer, filling the first trenches in the insulating material with a conductive material, polishing the conductive material to form conductive lines, etching at least a second trench in the insulating layer in between the conductive lines, the second trench having side walls and a bottom surface at a specified aspect ratio, depositing a ferromagnetic liner material at least over the conductive lines and the second trench, and removing the ferromagnetic liner material from the bottom surface of the second trench to form ferromagnetic liners of the conductive lines, comprising:
   an insulating layer, the insulating layer having at least two first trenches and at least a second trench; and
   a ferromagnetic liner material.

12. The MRAM cell of claim 11, comprising:
   at least one magnetic tunneling junction (MTJ);
   an insulating layer made of non-conductive, isolating material over the at least one MTJ; and
   at least two adjacent conductive lines in the insulating layer, each one of the conductive lines having a ferromagnetic liner made of ferromagnetic material comprised of top and side wall layers, the ferromagnetic liner having rounded corners connecting the top and side wall layers.

* * * * *

UNITED STATES PATENT AND TRADEMARK OFFICE
CERTIFICATE OF CORRECTION

PATENT NO. : 7,083,990 B1
APPLICATION NO. : 11/044729
DATED : August 1, 2006
INVENTOR(S) : Leuschner It is certified that error appears in the above-identified patent and that said Letters Patent is hereby corrected as shown below:

On title page item (73) Assignees: Should read

Infineon Technologies AG, Munich (DE)
Altis Semiconductor, Corbeil Essonnes (FR)

Signed and Sealed this

Nineteenth Day of June, 2007

JON W. DUDAS
*Director of the United States Patent and Trademark Office*